United States Patent
Suguro et al.

(10) Patent No.: US 6,570,169 B2
(45) Date of Patent: *May 27, 2003

(54) APPARATUS FOR MANUFACTURING A SEMICONDUCTOR DEVICE AND A METHOD FOR MANUFACTURING A SEMICONDUCTOR DEVICE

(75) Inventors: Kyoichi Suguro, Kanagawa-ken (JP); Katsuya Okumura, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/036,453

(22) Filed: Jan. 7, 2002

(65) Prior Publication Data

US 2002/0053645 A1 May 9, 2002

Related U.S. Application Data

(60) Continuation of application No. 09/722,477, filed on Nov. 28, 2000, now Pat. No. 6,365,492, which is a division of application No. 09/007,053, filed on Jan. 14, 1998, now Pat. No. 6,239,441.

(30) Foreign Application Priority Data

Jan. 20, 1997 (JP) .............................................. 9-007876

(51) Int. Cl.$^7$ ............................................. H01J 37/317
(52) U.S. Cl. ............................ 250/492.21; 250/443.1; 250/441.11
(58) Field of Search ......................... 250/492.21, 443.1, 250/441.11

(56) References Cited

U.S. PATENT DOCUMENTS

| | | | |
|---|---|---|---|
| 4,475,045 A | 10/1984 | Holden et al. | 250/441.11 |
| 4,911,103 A | 3/1990 | Davis et al. | 118/725 |
| 5,059,448 A | 10/1991 | Chandra et al. | 427/53.1 |
| 5,357,115 A | 10/1994 | Asakawa et al. | 250/492.21 |
| 5,879,574 A | 3/1999 | Sivaramakrishna et al. | 216/60 |
| 6,239,441 B1 * | 5/2001 | Suguro et al. | 250/492.21 |

FOREIGN PATENT DOCUMENTS

| | | |
|---|---|---|
| JP | 3-66122 | 3/1991 |
| JP | 4-162618 | 6/1992 |

* cited by examiner

Primary Examiner—Jack Berman
(74) Attorney, Agent, or Firm—Finnegan, Henderson, Farabow, Garrett & Dunner, L.L.P.

(57) ABSTRACT

The purpose of the present invention is to avoid a decrease in the mechanical strength of a Si substrate because of the repetition of ion-implantation and annealing processes. As ions are implanted while the Si substrate surface temperature is kept at as low as −60° C. or less. Then the Si substrate is heated to recover the implantation defects caused by the ion-implantation. Such a combination of the low temperature ion-implantation and the annealing processes is repeated as required.

13 Claims, 8 Drawing Sheets

APPARATUS FOR MANUFACTURING A SEMICONDUCTOR DEVICE AND A METHOD FOR MANUFACTURING A SEMICONDUCTOR DEVICE

This is a continuation of application Ser. No. 09/722,477, filed Nov. 28, 2000 now U.S. Pat. No. 6,365,442 which is a division of application Ser. No. 09/007,053, filed Jan. 14, 1998 issued as U.S. Pat. No. 6,239,441 B1, all of which are incorporated herein by reference.

BACKGROUND OF THE INVENTION

1. Technical Overview

This invention relates to a method for manufacturing a semiconductor device and an apparatus for manufacturing a semiconductor device. The invention includes a series of processes comprising an ion-implantation step followed by annealing process.

2. Background of the Invention

Recently, most computers and communication equipment have employed a large number of LSIs (large scale integrated circuit) in their core units, where many transistors and resistors are connected to form electrical circuits, integrated and formed into one chip. Therefore, the entire equipment performance depends on the performance of a single LSI unit. Higher integration enhancement improves the single LSI unit performance, and also achieves device down-scaling.

The device down-scaling can be accomplished by optimizing both an ion-implantation step, where a diffusion region, e.g. a source-drain diffusion region, is formed, and a subsequent annealing process. The means are available to produce an MOS transistor, having for example, a shallower source drain diffusion region than 0.2 $\mu$m each.

In order to form a shallow diffusion region, it is required to use a low thermal exposure to not only distribute impurity atoms shallowly in the ion-implantation step, but also to prevent impurities from diffusing deeply in the subsequent annealing process. Thermal exposure is a function of both temperature and time.

However, if the thermal exposure budget is reduced, crystal defects occurring during manufacture can not be removed easily and remain therein.

On the other hand, according to the LSI defect analysis, the p-n junction leakage current is so high in a part of the cells that the charge retention characteristic may significantly deteriorate in a defective LSI. In many cases when the p-n junction leakage current is high, crystal defects due to dislocation are found.

Such crystal defects are frequently found in the vicinity of regions where various materials are buried in a semiconductor substrate, such as a trench capacitor and a trench isolation. In other words, if heterogeneity is buried in the semiconductor substrate, a heat stress occurs around the boundary between the heterogeneity and the semiconductor substrate as temperature rises or falls, because the rate of expansion for the semiconductor substrate differs from that of the heterogeneity.

The strength of a semiconductor substrate gradually decreases, whenever the semiconductor substrate is subjected to LSI processes. In order to examine the cause thereof, the inventor has observed how the mechanical strength of the Si substrate (Si substrate strength) and the maximum stress within the Si substrate (maximum stress within the Si substrate) change during LSI processes.

FIG. 1 shows experimental results, indicating the Si substrate strength and the maximum stress measured within the Si substrate in each process, when the LSI was manufactured according to the prior art manufacturing method. In FIG. 1, the horizontal axis denotes typical LSI processes sampled.

It is found in FIG. 1 that the maximum stress (solid line) within the Si substrate increases after the process to form the $Si_3N_4$ or $SiO_2$ layer by the CVD method, as well as after the annealing process following the ion-implantation step. At this time, the maximum stress within the Si substrate repeatedly increases and decreases, but does not show a monotones increase.

On the other hand, the Si substrate strength (dotted line) shows a nearly monotonous decrease, whenever the Si substrate is subjected to the process.

A slip or other defects, largely affecting the p-n junction characteristics, occur at points indicated by an arrow. As shown in FIG. 1., the maximum stress within the Si substrate exceeds the Si substrate strength at those points. In other words, plastic deformation occurs in the Si substrate, resulting in large defects at the time that the changing maximum stress within the Si substrate exceeds the decreasing Si substrate strength.

It is evident in FIG. 1 that a large decrease in the Si substrate strength appears in the ion-implantation step. The subsequent annealing process allows recovery of any implantation defects, and also increases the Si substrate strength to increase somewhat. In case of the second ion-implantation, a very little increase in the Si substrate strength appears after the annealing process.

The reason the Si substrate strength decreases is considered as follows.

In the ion-implantation, point defects (Frenkel defects) are formed within the Si substrate. The point defects can basically be recovered through the subsequent annealing process, but partly combine to cause dislocation.

Meanwhile, in fact point defects combine during the ion-implantation step, while larger defects (defect cluster) than point defects occur. The defect clusters have more stable energy than point defects, so they are seldom recovered through the annealing process after the ion-implantation, and tend to remain as a larger dislocation. Such a large dislocation decreases the Si substrate strength, as shown in FIGS. 2($a$)–2($d$).

FIG. 2($a$) shows a situation, where an As ion 33 is added into a non cooled or water cooled Si substrate 31 at about 3–5×$10^{15}$ cm$^{-2}$ and at acceleration voltage of about 20–40 keV. The beam current is about 10–20 mA. At this time, the temperature on the Si substrate 31 surface ranges from 25–60° C. at ion-implantation.

Initial defects occurring through this ion-implantation are point defects, such vacancy and interstitial atoms which occur at the moment when an As ion is doped into the Si substrate. In addition, ion kinetic energy is partly converted into thermal energy, which is added to point defects.

As a result, vacancies and interstitial atoms can move slightly. Accordingly, recombination of vacancy and interstitial atoms allows point defects to be slightly recovered in the vicinity of the bottom of an ion-implanted layer, that means moderate state between an amorphous state and crystal state. At the same time, defect clusters due to vacancy inter-bonding, or defect clusters due to interstitial atoms inter-bonding are generated. On the other hand, ions implanted at locations of the tail (on the substrate side)

region of the ion-implantation distribution easily diffuse into the interstice in the depth of the substrate even during ion-implantation, whereby defect clusters are also formed. As described above, the primary defects 32 are formed, consisting of defect clusters that have larger and more stable energy than point defects.

FIG. 2(b) shows a step, immediately after the said ion-implantation, wherein the annealing process is implemented for the Si substrate 31 in $N_2$ atmosphere at 850° C. for 30 minutes. The primary defects 32 are mostly recovered, as shown in FIG. 2(b). However, the secondary defects 34 larger than the primary defects 32, such as dislocation loops, is formed instead.

FIG. 2(c) shows a step wherein the second As ion-implantation is performed. As shown in the figure, the primary defects 32 are formed in the same manner as in the first As ion-implantation.

FIG. 2(d) shows a step wherein the second annealing process is implemented in $N_2$ atmosphere at 850° C. for 30 minutes. As shown in the figure, the primary defects 32 are recovered, but the secondary defects 34 are grown in larger secondary defects 34'.

According to the correlation between the Si substrate strength and these defects, the substrate strength decreases once when the primary defects 32 are formed by the first ion-implantation, but increases to such a degree that the primary defects 32 disappear by the subsequent annealing process.

Next, the primary defects 32 form again by the second ion-implantation so that the Si substrate strength remarkably decreases. The primary defects 32 are recovered by the subsequent annealing process. However, unlike the first ion-implantation, the existing secondary defects 34 form a core so as to form larger secondary defects 34' while the Si substrate strength slightly increases.

An additional stress larger than a certain level in this state inhibits the conversion of the substrate. Therefore, plastic deformation easily occurs and the defect grows to be a larger crystal defect, resulting in an increase in the p-n junction leakage current.

That is, there is such a problem that the repetition of an ion-implantation process and an annealing process results in a decreased Si substrate strength. Then, the stress causing plastic deformation in the Si substrate becomes smaller than the maximum stress within the Si substrate within a relatively short time. Further, the larger crystal defects occur, thereby increasing the p-n junction leakage current.

According to the conventional method as described above, the ion-implantation into the Si substrate followed by the annealing process cannot effectively decrease crystal defects within the Si substrate. In addition, as the ion-implantation and the annealing process are repeated, the Si substrate strength significantly decreases.

Japanese Kokai patent PH03-66122 discloses a method to cool a wafer stage during ion-implantation. Japanese Kokai patent PH04-162618 further discloses rapid annealing immediately after ion-implantation with cooled wafer stage. However, those prior art methods never provide a way to completely reduce crystal defects. Furthermore, those methods have a problem of $H_2O$ remaining on a semiconductor substrate.

The purpose of the present invention is to solve the aforesaid problems and to provide a method for manufacturing a semiconductor device, which can prevent the mechanical strength of a semiconductor substrate from decreasing through ion-implantation process and the subsequent annealing process, as well as to provide a semiconductor device effective for the implementation.

SUMMARY OF THE INVENTION

To achieve the above object, the present invention provides a method for manufacturing a semiconductor device which comprises:

implanting ions to a semiconductor substrate while a temperature on said semiconductor substrate is kept at a level lower than a predetermined temperature;

avoiding a surface of said semiconductor substrate from being frosted; and annealing said semiconductor substrate after said step of implanting ions.

Also, the present invention provides a method for manufacturing a semiconductor device which comprises implanting ions to a semiconductor substrate under a predetermined condition;

annealing said semiconductor substrate after ion implanting step;

wherein said predetermined condition determined to keep a minimum strength of said semiconductor substrate larger than 500 MPa after said steps of implanting and annealing are repeated at least two times.

Furthermore, the present invention provides an apparatus for manufacturing a semiconductor device comprising;

a wafer stage for supporting a semiconductor substrate;

an ion-implanting instrument for implanting ions to said semiconductor substrate on said wafer stage;

a heat sink ,provided at said wafer stage, for keeping said semiconductor substrate low temperature;

a heat trap for avoiding the surface of said substrate from being frosted; and a heating source for annealing said semiconductor substrate.

The inventors have examined how a Si substrate strength and the maximum stress within the Si substrate change in the course of the LSI process in order to find the reason why semiconductor substrate strength decreases through the LSI process.

As a result, it was suggested that the repetition of an ion-implantation step and an annealing process cause large defects to form within the Si substrate, by which the Si substrate strength decreases. That is, when critical stress, causing plastic deformation to occur in the Si substrate, becomes smaller than the maximum stress within the Si substrate, large crystal defects occur. Accordingly, a problem, such as an increased pn junction leak current, arises.

Therefore, the present invention employs a concept of setting the conditions for the ion-implantation step and annealing step, thus allowing the stress that causes plastic deformation in the semiconductor substrate to be larger than the maximum stress within the semiconductor substrate.

For example, ions are added to a semiconductor substrate under the condition where the temperature on the surface of the semiconductor substrate is kept at a level lower than the predetermined temperature. Further, the walls for the end station 14 are equipped with a heat trap. The heat trap cools the atmosphere in order to avoid the surface of the semiconductor substrate from being frosted with $H_2O$.

That is, point defects will hardly transfer while the temperature is kept low, even if ion kinetic energy is partly converted to thermal energy. As a result, defect clusters brought by clustering of vacancies or interstitials are fully suppressed. Further, water frost will not form on the surface of the semiconductor wafer because of the heat traps in the end station.

Hence, the primary defects after the ion-implantation step consisting only of point defects. Such primary defects can be completely or mostly recovered by the following annealing process. Therefore, large defects, which cause a substrate strength decrease, can be completely prevented from occurring.

In addition to the above condition, it is preferable to set an increased heating rate in the annealing process. The increased heating rate can minimize the time for a temperature range where the secondary defects are easily formed so that the secondary defects can be effectively suppressed. This will be effectively achieved by providing heat traps to the end station walls.

Moreover, the apparatus for manufacturing the semiconductor device according to the present invention can keep a semiconductor substrate surface temperature low during ion-implantation with avoiding the surface of the semiconductor substrate from being frosted. Therefore, a method for manufacturing the semiconductor device according to the present invention can be easily implemented.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

(1st Embodiment)

The inventor implanted As ions into a (100) Si substrate under acceleration energy 20–40 keV and $3\times10^{15} cm^{-2}$ dose amount while varying the Si substrate surface temperature (the temperature of the substrate). Then the inventor carried out channeling measurement by irradiating He ions with RBS after changing the substrate temperature from −180° C. to 200° C.

A heat trap is provided in the end station in order to prevent the surface of the semiconductor substrate from being frosted.

Figure 1:
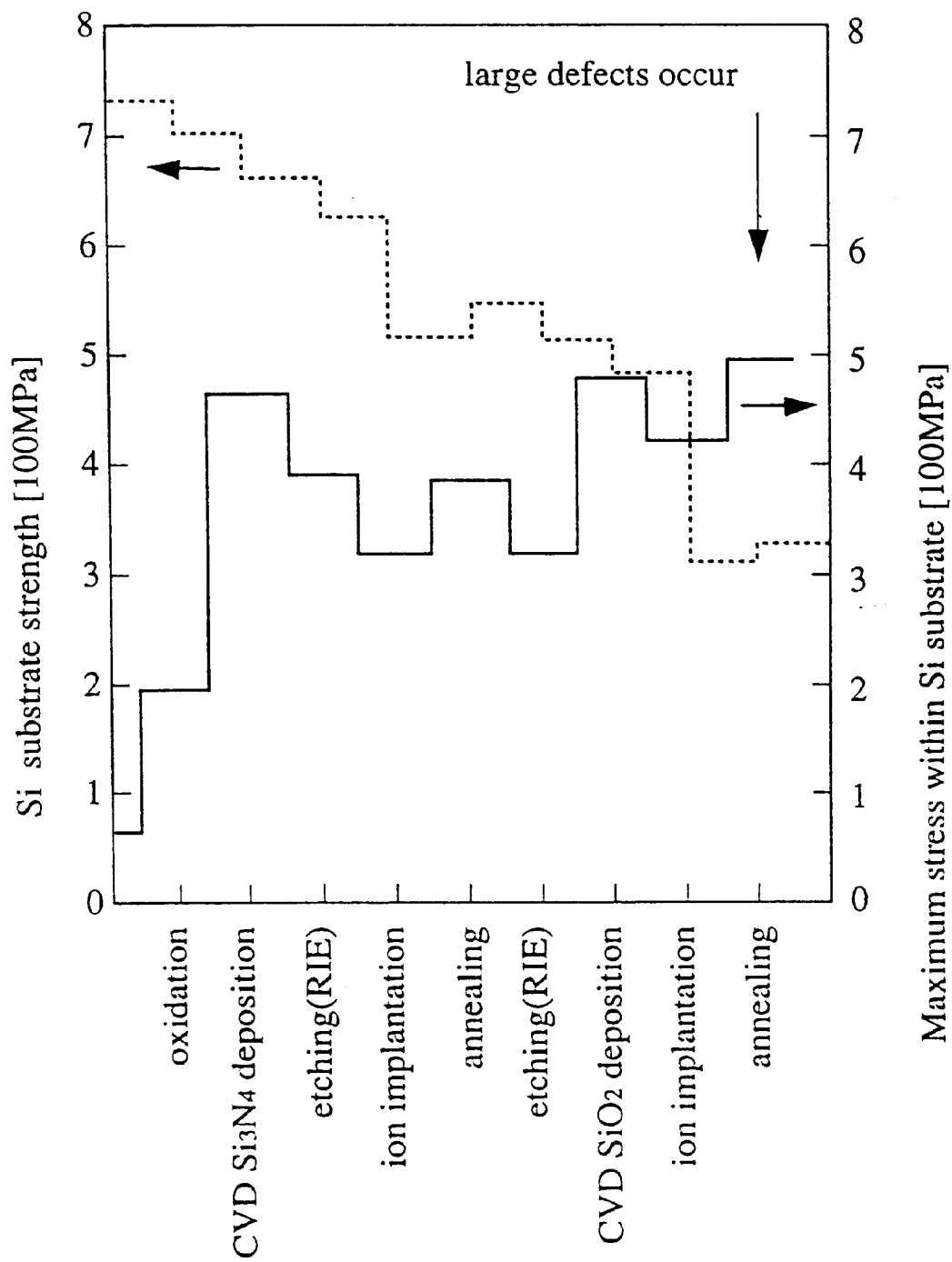
FIG. 1 is a graph showing the Si substrate strength and the maximum stress within the Si substrate in each process when LSIs are manufactured according to the conventional method.
Figure 2:
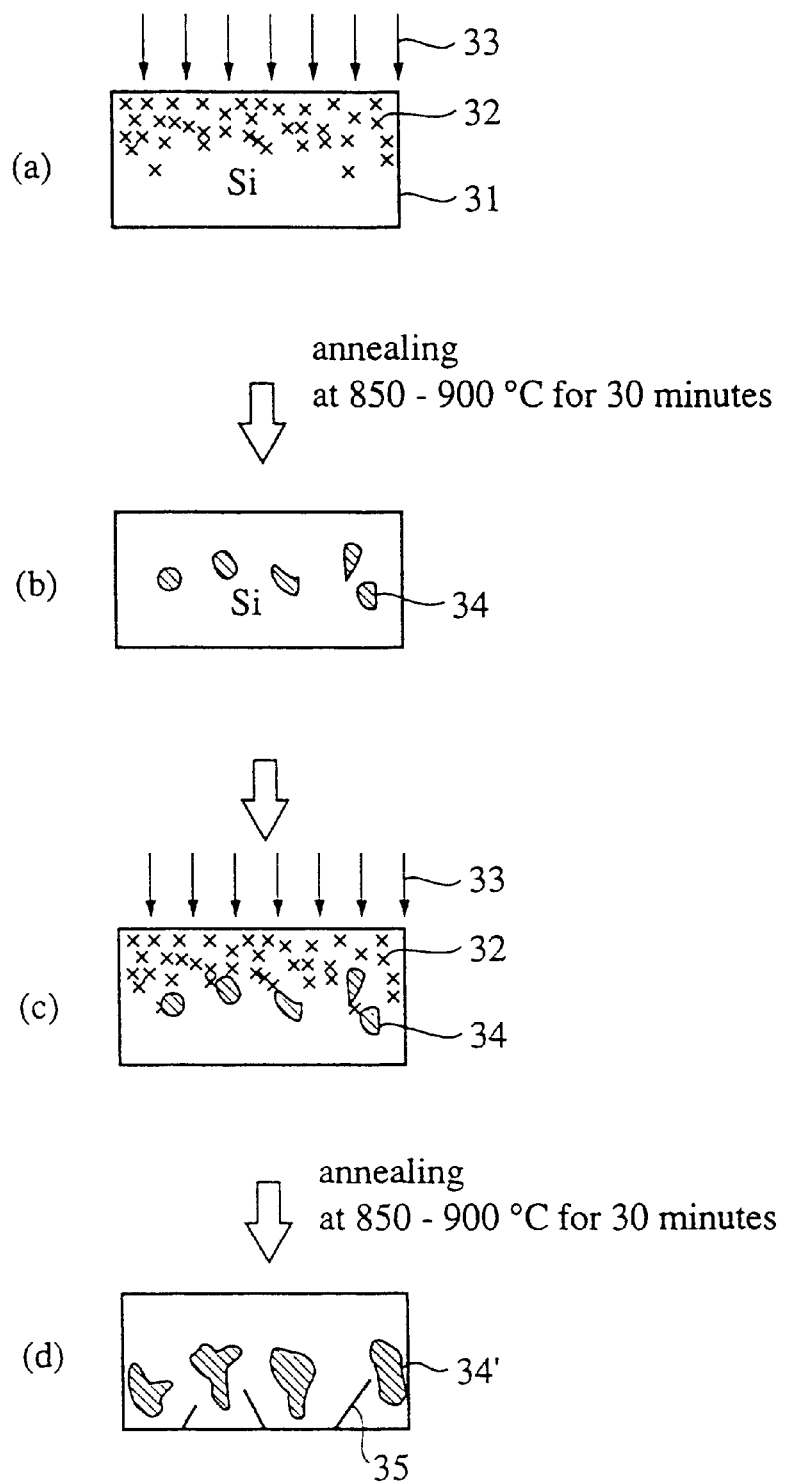
FIGS. 2(a)–2(d) are a cross sections through a conventional semiconductor device during the manufacture.
Figure 3:
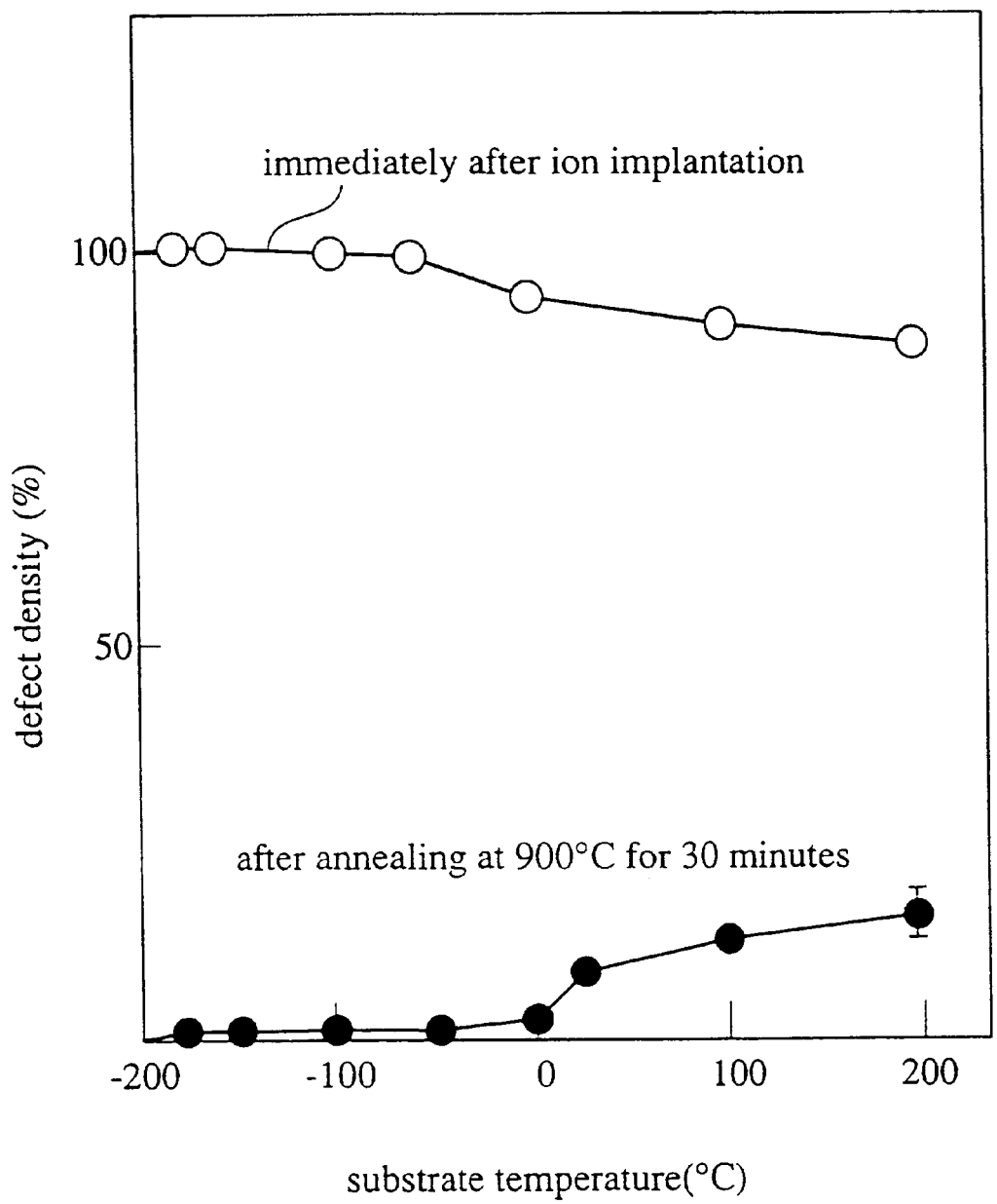
FIG. 3 is a graph showing the relation between the substrate temperature and defect density immediately after the ion-implantation and after the annealing process.

FIG. 3 shows the result of the measurement. As shown in FIG. 3, immediately after the ion-implantation step, the lower the substrate temperature, the higher the defect density and the worse the crystallinity became. However, when annealing at 900° C. for 30 min was implemented, the lower the substrate temperature, the lower the defect density became.

FIG. 3 also shows that the defect density was low enough particularly when the substrate temperature was as low as 20° C. or less, during ion-implantation. In contrast, the defect density was 0% within the range of measuring accuracy when the substrate temperature was less than −100° C.

The aforesaid results suggest that since atoms become difficult to move as the substrate temperature decreases, point defects scattered immediately after the ion-implantation can be prevented from transferring and combining with one another even if ion kinetic energy is partly converted to thermal energy. Accordingly the defect clusters formation can be avoided.

These scattered point defects (primary defects) are energetically more unstable than defect clusters. Thus they can fully recover by the annealing process after the ion-implantation, thereby recovering the implantation defects. In other words, Si made in amorphous state by the ion-implantation returns to the mostly original monocrystal Si.

As described above, according to this embodiment, the substrate temperature being kept low (under the condition with avoiding the surface of the substrate from being frosted) during the ion-implantation can fully suppress the defect cluster formation, thereby effectively preventing the substrate strength from decreasing. Further, such Si substrates with no substrate strength decrease sufficiently prevent warps from occurring so that they are suitable for miniaturization.

Moreover, while the Si substrate is described in this embodiment, other semiconductor substrates being kept at 20° C. or less can achieve the sufficiently low defect density. For the substrate being kept at −100° C. or less, the defect density will be 0% in the range of the measuring accuracy.

(2nd Embodiment)

FIGS. 4(a)–4(d) show a process sectional views of a method for manufacturing the semiconductor device according to the second embodiment. In this embodiment, a combination of an ion-implantation and annealing as in the first embodiment is repeated twice.

First, as shown in FIG. 4(a), the inventor implanted As ions 3 into a Si substrate 1 under 20–40 keV acceleration energy and 3–5×10$^{15}$cm$^{-2}$ dose amount while keeping the substrate surface temperature lower than room temperature, preferably, −60° C. or less. The primary defects 2 caused by the ion-implantation are point defects, such as vacancies and interstitial atoms, generated instantaneously after that As ions were shot into the Si substrate 1.

At this time, although the beam current was about 10–20 mA, the Si substrate 1 surface temperature could be maintained within the predetermined temperature range during ion-implantation by using a heat sink susceptor with a high thermal conductivity.

Figure 4:
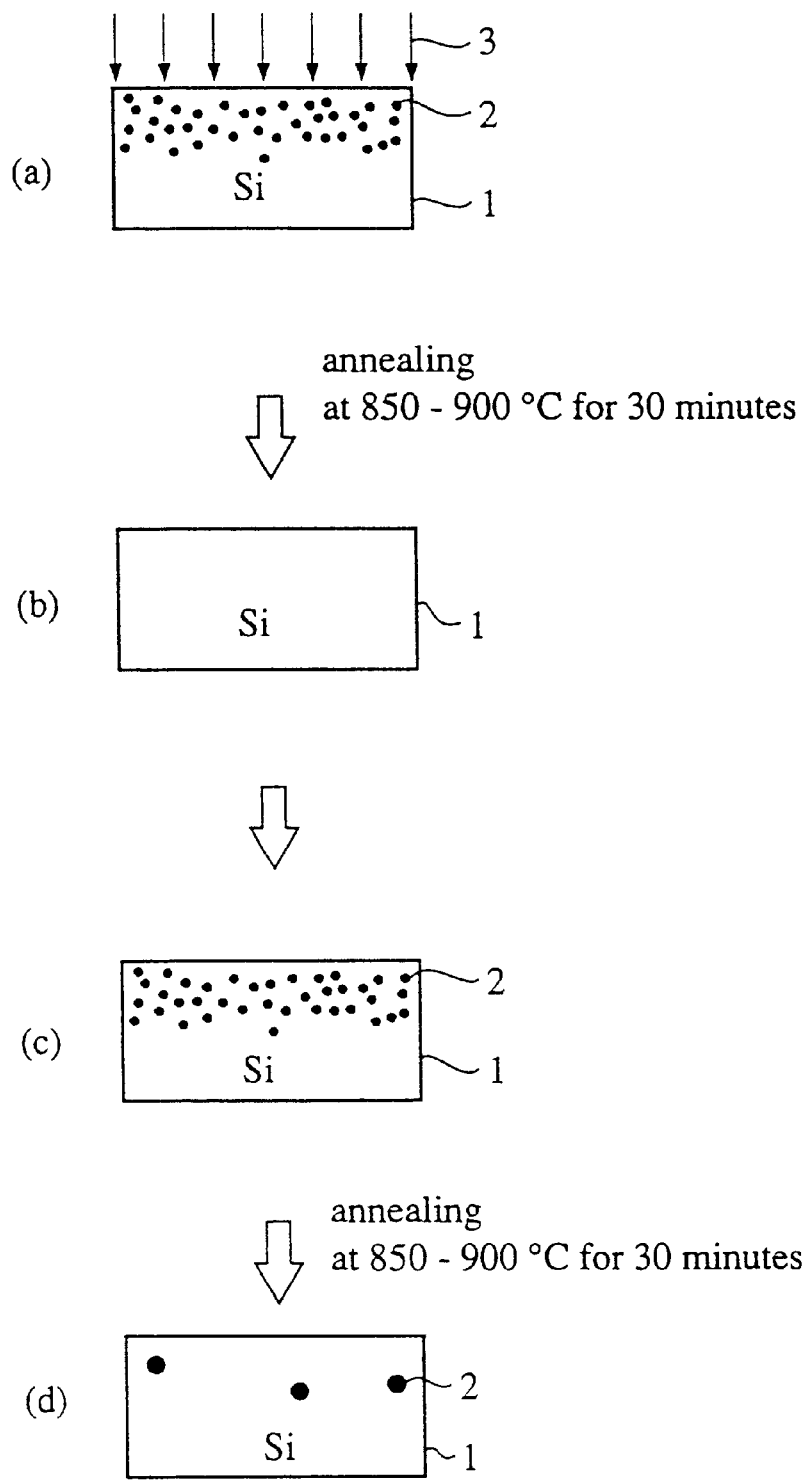
FIGS. 4(a)–4(d) are a cross-sections through the semiconductor device in accordance with a second embodiment during the manufacture thereof.

As shown in FIG. 4(*b*), the primary defects 2 could be fully recovered by performing on the Si substrate 1 an annealing process in N$_2$ atmosphere, at 850–900° C., for 30 min.

Next, as shown in FIG. 4(*c*), the second ion-implantation step was carried out. At this time, the Si substrate 1 surface temperature was maintained low during the ion-implantation in the same manner as in the first ion-implantation step.

Then, as shown in FIG. 4(*d*), the second annealing process (N$_2$ atmosphere, 850–900° C., 30 min) was conducted.

Of the secondary defects 3 generated by the second ion-implantation and annealing process, only small dislocations remain slightly.

Figure 5:
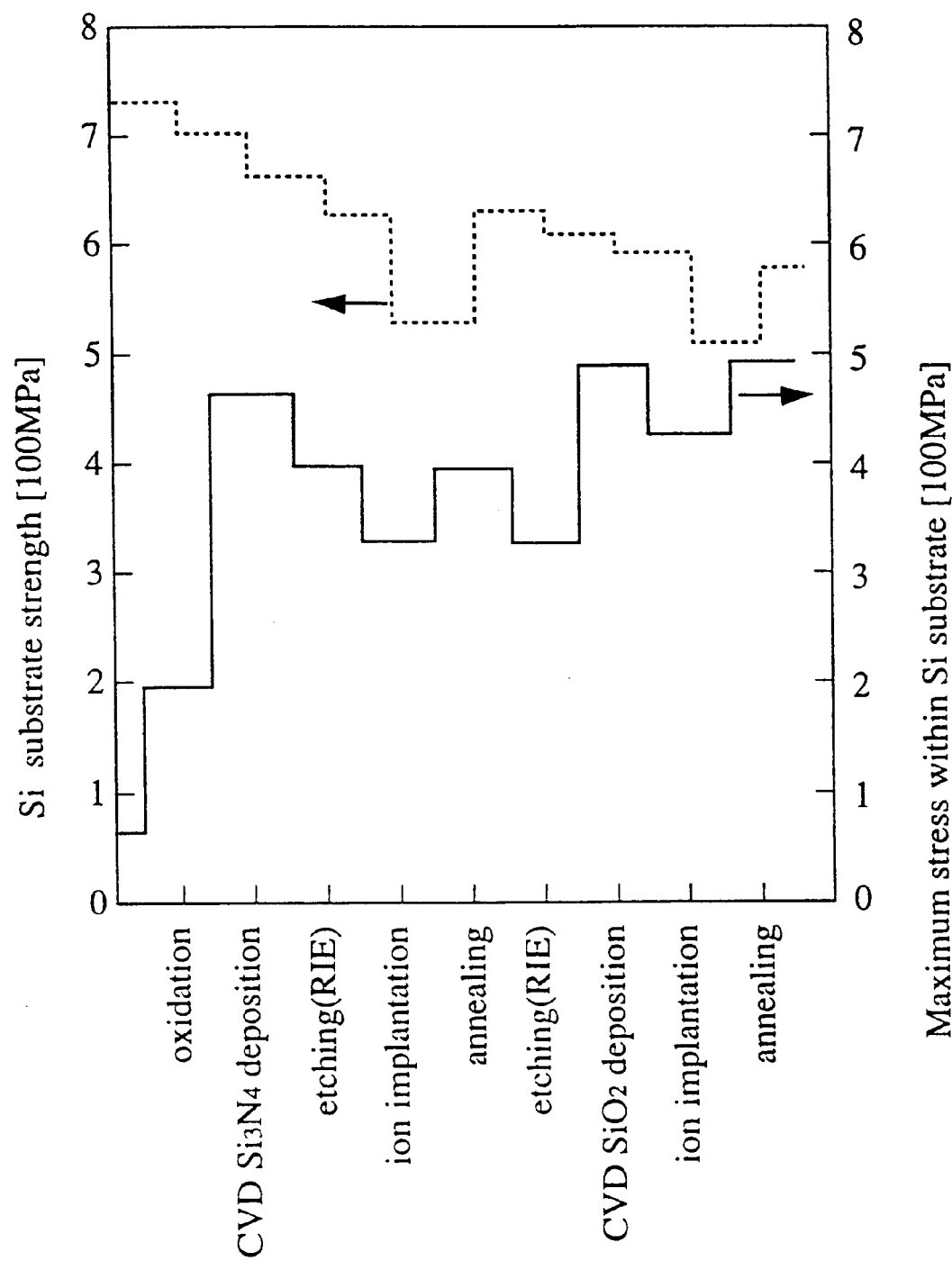
FIG. 5 is a graph showing the Si substrate strength and the maximum stress within the Si substrate in each process when LSIs are manufactured according to the second embodiment.
Figure 6:
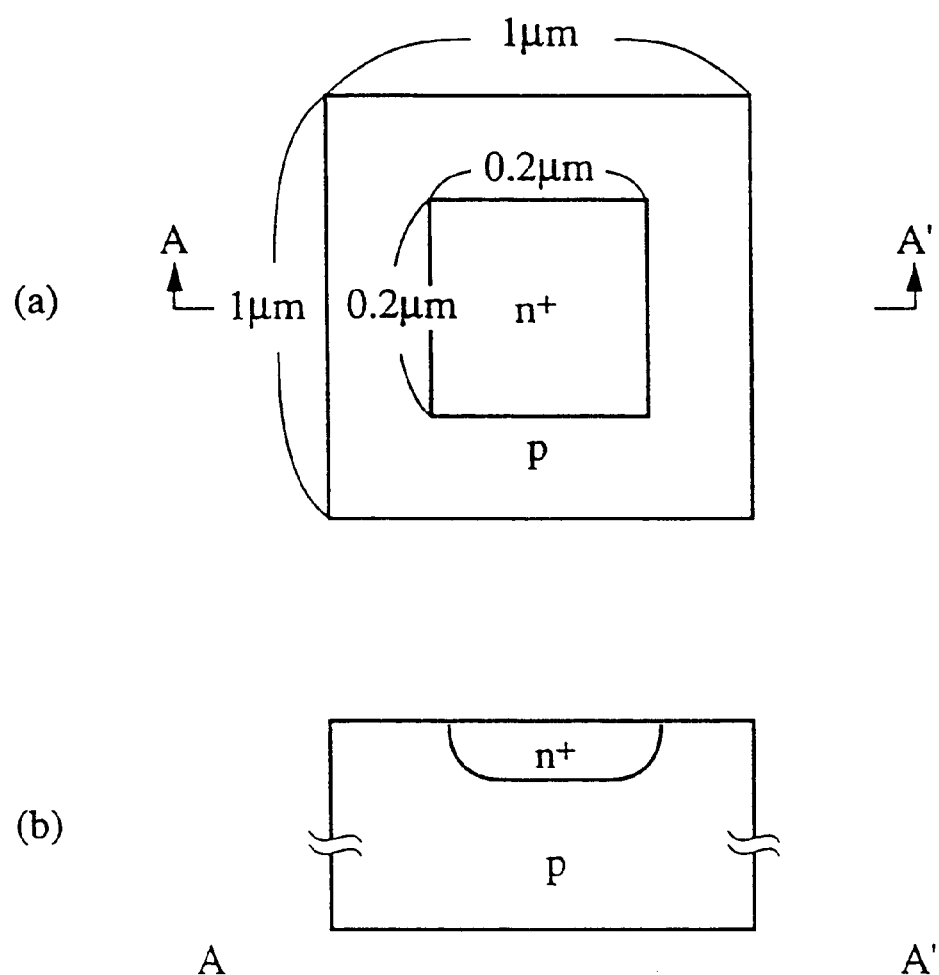
FIG. 6(a) is a plane view showing the n+/p junction formed to evaluate the second embodiment.
FIG. 6(b) is a cross-sectional view along the line A–A' of FIG. 6(a)

FIG. 5 shows the Si substrate mechanical strength (Si substrate strength) (doted line) and the maximum stress within the Si substrate (solid line) for each process when a LSI is manufactured according to the embodiment.

The Si substrate strength decreased once at the step when the primary defects (point defects) was generated by the first ion-implantation step. However, the primary defects were mostly recovered by the following annealing process, and the Si substrate strength returned to the original state before the ion-implantation.

Subsequently, when point defects were introduced by the second ion-implantation, the Si substrate strength largely decreased again. However, the second annealing process recovered nearly complete crystal (90% or more), and the Si substrate strength returned to the state close to that before the second ion-implantation step.

The above result suggests that unlike the conventional method, the second annealing process caused no large defects (2nd defects) to occur in the Si substrate.

According to the embodiment, a combination of an ion-implantation step and an annealing process was performed twice so as to form the plural number of n+(0.2 $\mu$m on a side)/p junction, as shown in FIG. 4. Then the mean leak current (nA per junction) was measured. The resulting value was as low as (nA/junction) when 5V was applied. That is, the mean leak current could be reduced by 3 to 4 orders of magnitude lower than the conventional method.

While the combination of an ion-implantation and an annealing process was implemented twice in this embodiment, performing this for more than three times can inhibit the Si substrate strength drop more effectively than the conventional method.

(3rd Embodiment)

To form shallow diffusion layers, having e.g. less than 0.2 $\mu$m each, source and drain diffusion layers, the temperature should be less than 800° C. when the annealing process time is more than 30 min. However, in case that annealing temperature is high but the annealing time is within as short as 1 min, a rapid heating process at about 900–950° C. can be performed. This embodiment describes an example that employs a combination of such a rapid heating process and the low temperature ion-implantation in the first embodiment.

According to the embodiment, the rapid heating process can minimize the time taken to be in the temperature range of 600–700° C., where crystal defects (primary defects) easily grow to the secondary defects, thereby effectively decreasing the defect density. Further, the deterioration speed of semiconductor substrates (the degree of a substrate strength drop per process) can also be reduced.

Moreover, using the combination of the low temperature ion-implantation and the rapid heating process can prevent impurities from diffusing deeply. Therefore, shallow layers, for example source and drain diffusion layers with 0.2 $\mu$m thickness each can be easily formed. Furthermore, as described above, an effectively reduced defect density minimizes the pn junction leak current sufficiently.

Further, the heating rate for the rapid heating process after the ion-implantation is 10° C./sec. or more, or preferably, 50° C./sec. Annealing at about 500–600° C., instead of such a rapid heating process, followed by high-temperature annealing at 700° C. or more can also lower the defect density effectively. In the first annealing the primary defects (point defects) mostly recover and then completely recover in the subsequent high-temperature annealing.

(4th Embodiment)

Figure 7:
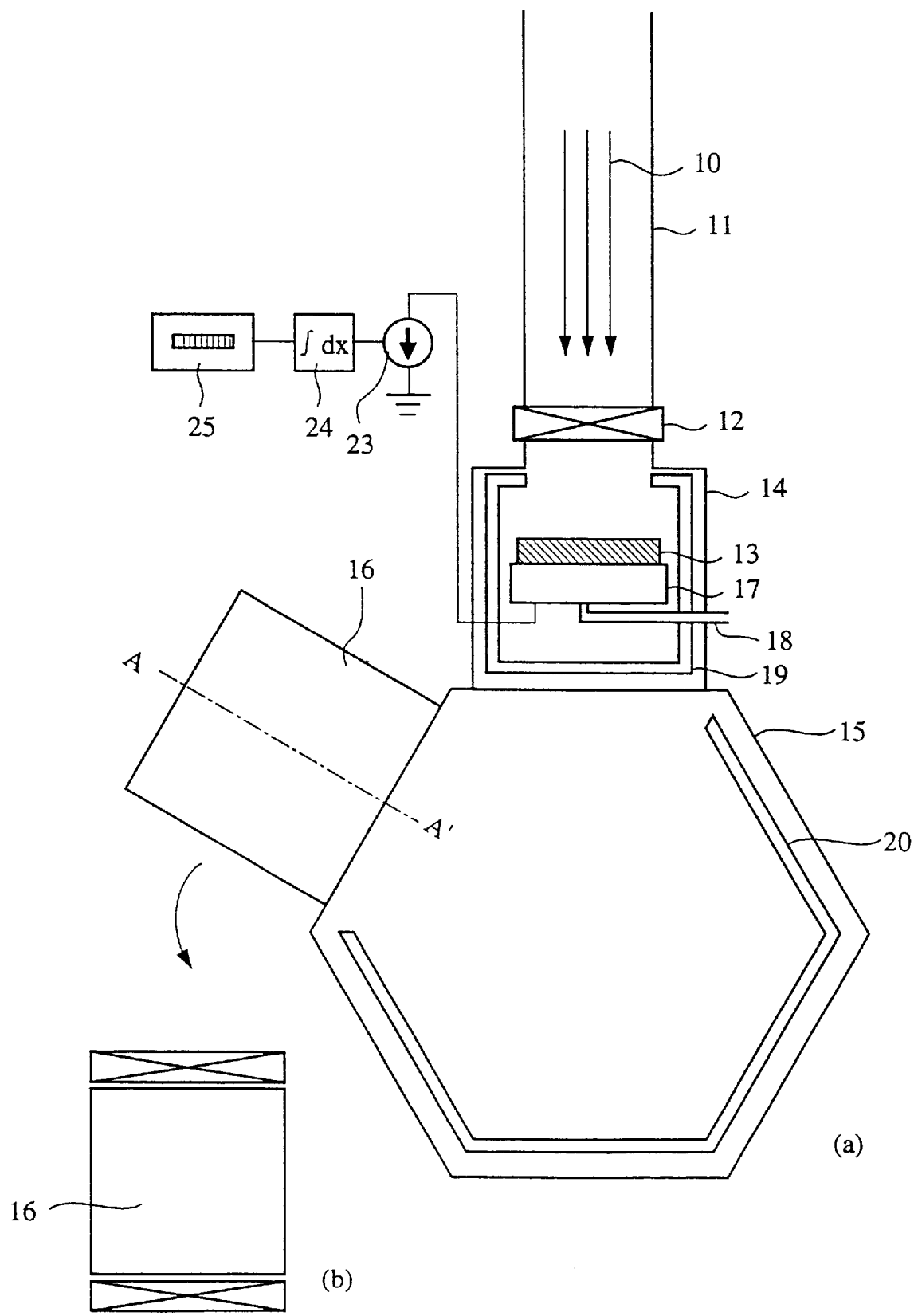
FIG. 7(a) shows a core unit of a low temperature ion implanter with an annealing function according to the 4th embodiment of the present invention.
FIG. 7(b) shows the cross-sectional view along with the line A–A' of FIG. 7(a)

FIG. 7 shows the core unit (where a semiconductor substrate is installed) of a low temperature ion implanter with an annealing function according to the 4th embodiment of the present invention. In addition, FIG. 7(*a*) shows the unit viewed from top. FIG. 7(*b*) shows the cross-sectional view of the heating chamber 16 along with the line A–A'.

The core unit of the low temperature ion implanter includes:

- a beam line 11 through which ion beams 10 pass;
- a semiconductor substrate (wafer) 13 that is connected with the beam line 11 through an open/close valve 12, and to which the ion beams 10 are irradiated;
- an end station 14 with an internal cooling mechanism;
- a heating chamber 16 that is connected with the end station 14 through a carrier chamber 15 to perform the annealing process (RTA). Ion beams 10 are made by ion implanting instrument (not shown).

The cooling mechanism of the end station 14 comprises;

- a heat sink 17 for cooling the semiconductor substrate 13 that is arranged on a wafer stage (that includes susceptor (not shown) or fixed on a rotational disk (not shown));
- a pipe 18 allowing the heat sink 17 to pass refrigerant;
- a heat trap 19 where the surface temperature is lower than that of the surface of the semiconductor substrate 13. The heat trap might also be called a cold trap or a heat exchanger.

The heat trap 19 covers at least some part of side of the semiconductor substrate 13, so a shape of the heat trap 19 can be diversified. For example, the heat trap 19 may have a doughnut shape instead of the shape showed in FIG.7. In that case, the semiconductor substrate 13 is placed in a hole of the doughnut.

The heat trap 19 can prevent frost, caused by H$_2$O remaining in the end station 14 after exhaust, from adhering to the semiconductor substrate 13 even if the semiconductor substrate 13 is cooled. The frost adhesion should be avoided because it obstructs the rapid heating process.

Such a cooling mechanism can keep the temperature difference between the surface of the semiconductor substrate 13, and the susceptor or the stage of the rotational disk, on which the semiconductor substrate 13 is arranged, within 10° C.

In other words, such a cooling mechanism can cool the semiconductor substrate 13 to the same degree as the stage so that the surface temperature of the semiconductor substrate 13 can be set at as low as −100° C. or less.

Since an exhaust system (not shown) is installed in the carrier chamber 15, H$_2$O partial pressure can be set at 1×10$^{-6}$ Torr or less. The exhaust system is, for example, turbo molecular pumps with a liquid nitrogen trap. Further in the carrier chamber 15, a trap 20 is installed similar to the end station 14, thereby preventing frost from forming in the semiconductor substrate 13 when carrying.

The heating chamber 16 includes a heating source, capable of rapidly heating the semiconductor substrate 13. For example, such a heating source may be a substrate heater that directly heats the semiconductor substrate 13, or a heater that heats the semiconductor substrate 13 by irradiating infrared or ultra violet rays.

The ion implanter, according to the embodiment, has a cooling mechanism, capable of keeping the surface temperature of the semiconductor substrate 13 low enough to prevent defect clusters from occurring. Besides, the effect brought by the cooling mechanism is very high in that the semiconductor substrate 13 can be rapidly heated after the ion-implantation.

Therefore, the use of the ion implanter according to the embodiment facilitates the achievement of ion-implantation and annealing processes while keeping the decrease in the substrate strength as small as possible. Furthermore, the transfer of the semiconductor substrate 13 from the end station 14 to the heating chamber 16 is implemented sequentially under vacuum. Accordingly, the more reliable ion-implantation and annealing processes can be conducted compared to the case where the ion-implantation and annealing are carried out in different steps, respectively.

And moreover this core unit of the low temperature ion implanter includes; a instrument 23 for measuring charges of ions implanted to the substrate 13, an integral equipment 24, and a counter 25.

These measure an amount of ions implanted to the substrate 13, and its measurement is precisely done because of the gas generated from the resist would decrease by keeping the substrate 13 at low temperature. Especially because of heat trap equipped at the end station 14, the measurement is more precisely done.

Semiconductor devices manufactured by this apparatus, have good characteristics because gas contamination is prevented, as stated above.

Next, the ion-implantation step using the above ion implanter will be concretely described.

First, the open/close valve 12 is opened. Then, the ion beams 10 are irradiated to the semiconductor substrate 13 set within the end station 14. At this time, the cooling mechanism maintains the substrate temperature to the same degree as in the other embodiments (as low as 20° C. or less, preferably, −100° C. or less). Further, to avoid charge up of a semiconductor substrate 11 due to implanted ions, it is preferable to previously irradiate low energy electrons (30 eV or less) to the surface of the semiconductor substrate 13 during the ion-implantation.

An annealing process, which recovers implantation defects (primary defects) caused by the ion-implantation to a nearly complete level, follows the above step.

That is, the ion-implanted semiconductor substrate 13 was transferred sequentially under vacuum to the heating chamber 16 through the carrier chamber 15 that is exhausted (highly vacuumed). Then the semiconductor substrate 13 is heated to 700° C. or more, and subjected to the annealing process. Inside of the carrier chamber 15, there is a wafer handler coated with AlN. The wafer handler has a vacuum chuck to support the semiconductor substrate.

Meanwhile, the heating rate is preferably as high as 10° C./sec or more. This is because the primary defects caused by the ion-implantation easily combine to form defect clusters if a temperature range of 600–700° C. is passed at the rate of 100° C./minute or less. Moreover, the secondary defects formed by the growth of such defect clusters seldom recover even by heating at 700° C. or more.

Furthermore, the above embodiment describes the method wherein the temperature range in the middle (about 600 to 700° C.) after the ion-implantation is passed rapidly to implement annealing at 700° C. or more. In addition to this, ultimate recovery of crystal defects maybe achieved by annealing at 700° C. or more after recovering the primary defects before that the secondary defects grow by annealing at 600° C. or less.

Moreover, while no processing system of the ion implanter is described in the above, the system may employ either a wafer-by-wafer type or a batch type. In case of the wafer-by-wafer type, wafers (semiconductor substrate 13) are ion-implanted, carried, then heated within the heating chamber 16 one by one in the all steps. In case of the batch type, plural number of wafers are ion-implanted at the same time, collected from a disk wheel into a wafer cassette, transferred and located on a wafer board for a heating chamber, and then heated at the same time.

Further, while the embodiment describes the case of annealing within the heating chamber 16, another annealing process may be also performed by installing a heating mechanism in the heat sink 17, and by heating the semiconductor substrate 13 to 700° C. or more within the end station 14 after the ion-implantation.

(5th Embodiment)

This embodiment is a variation of the second embodiment.

First, regions of a Si substrate not to be ion-implanted are selectively coated and a mask pattern (ion-implantation mask) having a thermal expansion coefficient, about the same order as that of the Si substrate (about 3 ppm/K) is formed.

The reason why such a mask pattern is used is that a mask pattern having a thermal expansion coefficient of 15 ppm/K or more is peeled off by thermal stress when cooled.

Then the substrate surface temperature is kept low, preferably at −60° C. or less, and As ions 3 are implanted to the Si substrate 1 under 20–40 keV acceleration energy and 3–5×10$^{15}$cm$^{-2}$ doping amount. The primary defects caused by the ion-implantation are point defects, such as vacancies and interstitial atoms generated instantly when As ions are implanted into the Si substrate.

Though the beam current is about 10–20 mA, the use of a heat sink susceptor with a high heat conductivity realizes the condition wherein the Si substrate surface temperature is being kept at the above temperature during the ion-implantation.

When the mask pattern (ion implantation mask) is shaved by irradiating ions, contaminants are generated. The contaminants (e.g. $C_xH_y$) comprising the components of the mask pattern, are removed by oxygen plasma treatment.

Subsequently, in N$_2$ atmosphere an annealing process at about 850–900° C. for 30 minutes is implemented for the Si substrate so that the primary defects can be completely recovered.

Next the second ion-implantation is performed with the Si substrate surface temperature being kept low similar to the first ion-implantation.

Then the second annealing process (N$_2$ atmosphere, 850–900° C., 30 minutes) is carried out.

The second ion-implantation and annealing process result in only a few and small transformation as the secondary defects. This embodiment can also provide the same result as in the second embodiment. In addition, the method in this embodiment is effective for the steps e.g. the formation of CMOS n-type and p-type source/drain diffusion layers. In short, it is effective when conductive diffusion layers are formed in different steps, respectively.

(6th Embodiment)

Figure 8:
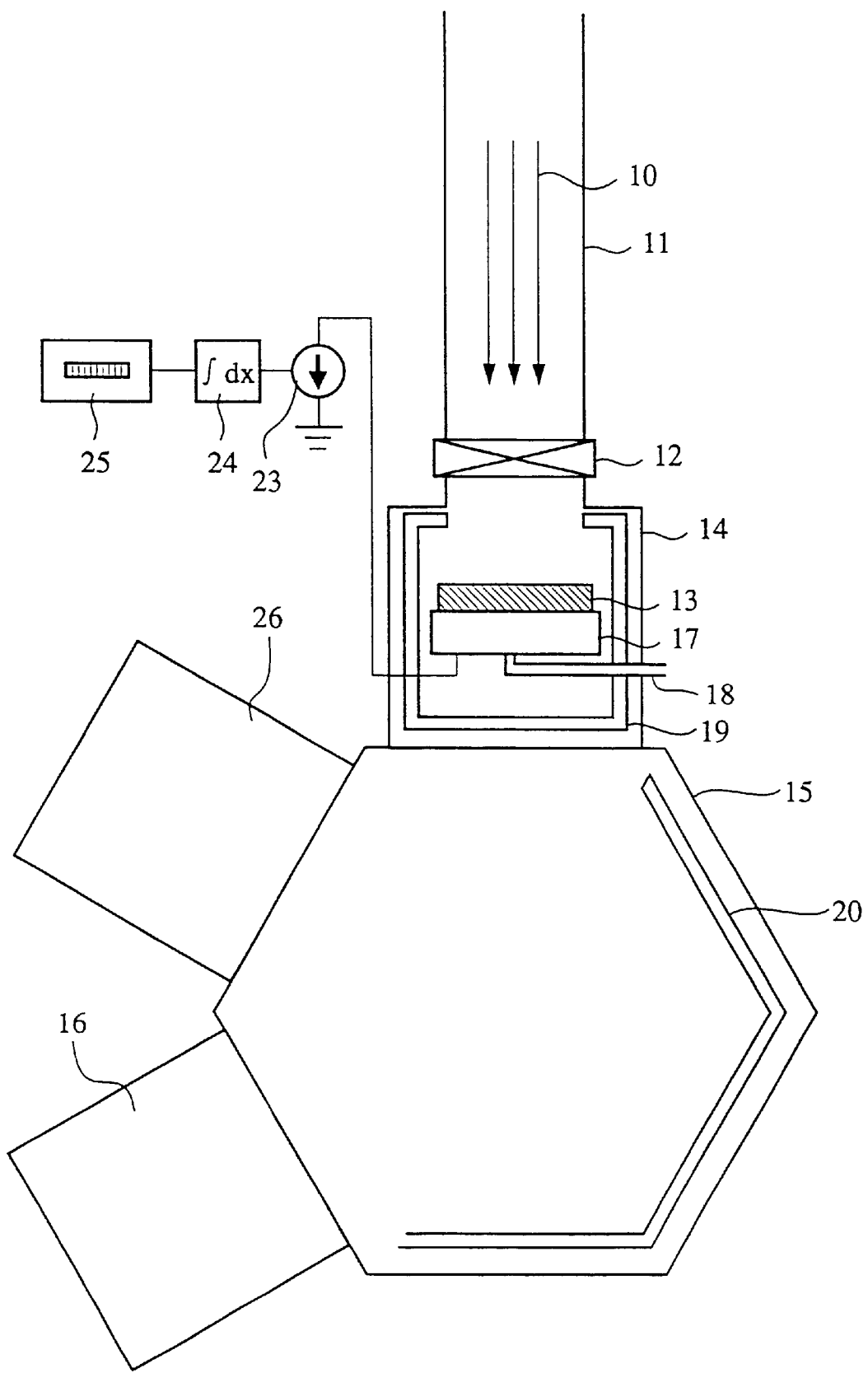
FIG. 8 shows a core unit of a low temperature ion implanter with an annealing function according to the 6th embodiment of the present invention.

FIG. 8 is a typical figure showing the core unit (where a semiconductor substrate is installed) of a low temperature ion implanter with resist ashing function and an annealing function according to the 6th embodiment of the present invention.

This embodiment is a variation of the 4th embodiment. First, regions of a Si substrate not to be ion-implanted are selectively coated and a mask pattern (ion-implantation mask) having a thermal expansion coefficient, about the same order as that of the Si substrate (about 3 ppm/K) is formed.

The substrate is set in a chamber 14 for ion implantation. Then the substrate surface temperature is kept low, preferably at −60° C. or less, and As ions or B ions or BF$_2$ ions (shown as 10) are implanted through the beam line chamber 11. After ion implantation, the substrate is move to a chamber 26 through the carrier chamber 15 for the removal of the mask pattern. The removal of the mask pattern is carried out by ashing the photoresist mask in a oxygen plasma.

Then, the substrate is moved to a chamber 16 through the carrier chamber 15 for annealing. The annealing may be better performed at around or above 700° C. by rapid ramp up rate (50° C./sec).

By using this embodiment, the substrate can be annealed immediately after ion implantation due to a sequential processing. And as a result, defects can be almost completely annealed out and the crystallinity of the substrate is almost well recovered as a initial state before ion implantation.

The described invention is not limited to the above embodiments. While in the said embodiments the condition is set so that the Si substrate strength is higher than the maximum stress within the Si substrate during the ion-implantation and after the annealing process, a condition may be set so that the Si substrate strength becomes higher than the maximum stress within the Si substrate although the Si substrate strength becomes lower than the maximum stress within the Si substrate. It is to be understood that changes and variations may be made without departing from the spirit or scope of the present invention.

According to the present invention, as fully described above, under the condition the critical stress causing plastic deformation in a semiconductor substrate is larger than the maximum stress within the semiconductor substrate, at least the ion-implantation step is carried out. Therefore, the method for manufacturing a semiconductor device can effectively avoid the decrease in the mechanical strength of a semiconductor substrate caused by the ion-implantation step.

Moreover the present invention can maintain a semiconductor surface temperature low during the ion-implantation, thus providing a semiconductor manufacturing apparatus that can easily achieve the method for manufacturing a semiconductor device according to the present invention.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. An ion-implanting apparatus for manufacturing a semiconductor device comprising:

an ion implanting instrument for generating ion beams;

a beam line through which the ion beams pass;

an end station for receiving the ion beams from said beam line, the end station being the subject of vacuum exhaustion;

an open/close valve inserted between the beam line and the end station for separating the end station from the beam line and through which the ion beams are irradiated;

a wafer stage arranged inside the end station for supporting the semiconductor substrate, said wafer stage being able to be cooled to lower the temperature of a surface of said semiconductor substrate;

a heat trap coupled to a side wall of said end station to partly surrounding the semiconductor substrate, for cooling an internal atmosphere of the end station.

2. The ion-implanting apparatus for manufacturing a semiconductor device according to claim 1, further comprising a heating source located in said end station for performing an annealing process within the end station.

3. The ion-implanting apparatus for manufacturing a semiconductor device according to claim 1, wherein a shape of the heat trap is of a doughnut shape, and the semiconductor device is arranged within a center hole of the doughnut shape.

4. An apparatus for manufacturing a semiconductor device comprising:

an ion implanting instrument for generating ion beams;

a beam line through which the ion beams pass;

an end station for receiving the ion beams from said beam line, the end station being the subject of vacuum exhaustion;

an open/close valve inserted between the beam line and the end station for separating the end station from the beam line and through which the ion beams are irradiated;

a wafer stage arranged inside of the end station for supporting the semiconductor substrate, said wafer stage being able to be cooled to lower the temperature of a surface of said semiconductor substrate;

a heat trap coupled to said end station for collecting molecules within an internal atmosphere of the end station;

an unit for measuring an amount of ions implanted to the substrate including an instrument for measuring charges of ions implanted to the substrate, an integral equipment coupled to the instrument and a counter coupled to the integral equipment;

a wafer carrier chamber for handling the semiconductor wafer;

a wafer handler mechanism for supporting the semiconductor wafer and for transferring the semiconductor wafer;

an exhaustion system coupled to the wafer carrier chamber for exhausting air inside the wafer carrier chamber; and a wafer carrier chamber heat trap coupled to said wafer carrier chamber for collecting molecules within an internal atmosphere of said wafer carrier chamber.

5. The apparatus for manufacturing a semiconductor device according to claim 4 further comprising a heating chamber coupled to the wafer carrier chamber, the heating chamber including a heating source capable of rapidly heating the semiconductor substrate.

6. The apparatus for manufacturing a semiconductor device according to claim 5 wherein the heating source included in the heating chamber irradiates rays of light.

7. The apparatus for manufacturing a semiconductor device according to claim 4 wherein the wafer handler mechanism has a chuck to support the semiconductor substrate.

8. The apparatus for manufacturing a semiconductor device according to claim 4 wherein the wafer handler mechanism is coated with AlN.

9. The apparatus for manufacturing a semiconductor device according the claim 5 wherein the heat source has a capability of heating the substrate at a heating rate as high as 10° C./sec or more.

10. The apparatus for manufacturing a semiconductor device according to claim 9 wherein the heat source has a capability to heat the substrate until the temperature reaches about 600° C. or more.

11. The apparatus for manufacturing a semiconductor device according to claim 5 wherein the heat source has a capability of heating the substrate at a heating rate of 50° C./sec.

12. The apparatus for manufacturing a semiconductor device according to claim 9 further comprising mask pattern removal chamber coupled to the wafer carrier chamber for ashing a photo-resist mask in an oxygen plasma.

13. The apparatus for manufacturing a semiconductor device according to claim 12 wherein the wafer handler mechanism transfers the semiconductor substrate from the end station and to the mask pattern removal chamber and then from the mask pattern removal chamber and to the heating chamber.

* * * * *